(12) United States Patent
Avanzino et al.

(10) Patent No.: US 7,129,133 B1
(45) Date of Patent: Oct. 31, 2006

(54) METHOD AND STRUCTURE OF MEMORY ELEMENT PLUG WITH CONDUCTIVE TA REMOVED FROM SIDEWALL AT REGION OF MEMORY ELEMENT FILM

(75) Inventors: Steven C. Avanzino, Cupertino, CA (US); Minh Tran, Milpitas, CA (US)

(73) Assignee: Spansion LLC, Sunnyvale, CA (US)

( * ) Notice: Subject to any disclaimer, the term of this patent is extended or adjusted under 35 U.S.C. 154(b) by 116 days.

(21) Appl. No.: 10/939,773

(22) Filed: Sep. 13, 2004

(51) Int. Cl.
*H01L 21/8242* (2006.01)

(52) U.S. Cl. .................. 438/244; 438/3; 438/243; 438/253; 438/386; 438/387; 438/396; 257/77; 257/296; 257/301; 257/303; 257/306; 257/310; 257/532

(58) Field of Classification Search ........ 438/243, 438/244, 253, 386, 387, 396, FOR. 220, 438/FOR. 430, 239, 240, 3; 257/296, 301, 257/303, 306, 532, E27.084, E21.646, 77, 257/310
See application file for complete search history.

(56) References Cited

U.S. PATENT DOCUMENTS

| | | | |
|---|---|---|---|
| 6,281,142 B1 * | 8/2001 | Basceri et al. | 438/771 |
| 6,344,413 B1 * | 2/2002 | Zurcher et al. | 438/678 |
| 6,656,763 B1 | 12/2003 | Oglesby et al. | |
| 6,686,263 B1 | 2/2004 | Lopatin et al. | |
| 6,746,971 B1 | 6/2004 | Ngo et al. | |
| 6,753,247 B1 | 6/2004 | Okoroanyanwu et al. | |
| 6,768,157 B1 | 7/2004 | Krieger et al. | |
| 6,770,905 B1 | 8/2004 | Buynoski et al. | |
| 6,773,954 B1 | 8/2004 | Subramanian et al. | |
| 6,781,868 B1 | 8/2004 | Bulovic et al. | |
| 6,787,458 B1 | 9/2004 | Tripsas et al. | |
| 6,940,112 B1 * | 9/2005 | Rhodes et al. | 257/295 |
| 2003/0025142 A1 * | 2/2003 | Rhodes et al. | 257/301 |
| 2004/0053465 A1 * | 3/2004 | Hong | 438/253 |
| 2005/0003609 A1 * | 1/2005 | Fazan et al. | 438/253 |

* cited by examiner

*Primary Examiner*—George Fourson
*Assistant Examiner*—Joannie Adelle Garcia
(74) *Attorney, Agent, or Firm*—Amin & Turocy, LLP

(57) ABSTRACT

Disclosed are methods and structures for fabrication of reliable and efficient memory cells. The methods involve formation of a conformal diffusion barrier layer in a via, deposition of an electrode material in the via, removal of a certain portion of the electrode material from the via to expose a the portion of the diffusion barrier layer, converting the exposed portion of the diffusion barrier layer into an oxide, forming a memory element film, and forming and patterning a top electrode. Improved electrical conduction and data retention from the memory element of a memory cell by preventing short circuits and leakage of current through the conductive diffusion barrier layer, and thereby enhanced reliability and performance of a memory cell are obtained.

22 Claims, 8 Drawing Sheets

METHOD AND STRUCTURE OF MEMORY ELEMENT PLUG WITH CONDUCTIVE TA REMOVED FROM SIDEWALL AT REGION OF MEMORY ELEMENT FILM

TECHNICAL FIELD

The present invention generally relates to semiconductor fabrication. More particularly, the present invention relates to methods and systems for forming memory cells with efficient diffusion barriers.

BACKGROUND ART

The basic functions of a computer and memory devices include information processing and storage. In typical computer systems, these arithmetic, logic, and memory operations are performed by devices that are capable of reversibly switching between two states often referred to as "0" and "1." Such switching devices are fabricated from semiconducting devices that perform these various functions and are capable of switching between two states at high speed. Electronic addressing or logic devices, for instance, for storage or processing of data, are made with inorganic solid state technology, and particularly crystalline silicon devices. Much of the progress in making computers and memory devices faster, smaller and cheaper involves integration, squeezing ever more transistors and other electronic structures onto a postage stamp sized piece of silicon. A postage stamp sized piece of silicon may contain tens of millions of transistors, each transistor as small as a few hundred nanometers. However, silicon based devices are approaching their fundamental physical size limits.

Inorganic solid state devices are generally encumbered with a complex architecture which leads to a high cost and a loss of data storage density. The circuitry of volatile semiconductor memories based on inorganic semiconductor material must constantly be supplied with electric current with a resulting heating and high electric power consumption in order to maintain stored information. Nonvolatile semiconductor devices based on inorganic semiconductor material have a reduced data rate and relatively high power consumption and large degree of complexity.

Therefore, a need exists in the art for improved systems and methods of memory storage, retention, and retrieval.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention exhibits advantageous features compared to conventional methods of memory cell fabrication. The present invention provides methods and structures for preventing short circuit and leakage of current around the memory element films of a memory cell, which facilitates manufacture of reliable and cost effective memory devices.

In one aspect of the present invention, methods are provided for changing one or more conductivity properties of a diffusion barrier layer adjacent to memory element films of a memory cell. The methods include forming a conformal diffusion barrier layer over an opening formed in a dielectric layer of a semiconductor substrate, deposition of an electrode material into the opening, planarizing the electrode material layer, removing of part of the electrode material from the opening to expose a portion of the diffusion barrier layer, oxidizing the exposed portion of the diffusion barrier layer, forming memory element films, forming a top electrode, and patterning the memory cell.

In another aspect of the present invention, memory cells are provided which exhibit better distribution of current in the cell materials, and thereby, better control of conduction properties of the cell. The structures contain a bottom electrode, a memory element film over the bottom electrode, a top electrode over the memory element film, and a diffusion barrier layer at least surrounding the bottom electrode, the memory element film, and the top electrode. Further, the diffusion barrier layer adjacent the memory element film and the top electrode contain an oxidized material.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF INVENTION

The present invention relates to methods and structures that prevent and/or eliminate short circuit and leakage of current around memory element films of a memory cell. The methods involve modifying conductivity properties of a diffusion barrier layer by oxidizing the diffusion barrier layer in areas adjacent to memory element films and a top electrode of a memory cell. The insulating properties of the resulting oxidized diffusion barrier layer prevent short circuit and leakage, and thereby enhance the conduction of memory films of the memory cell.

In general, the conductive properties of memory cells are influenced by the electrical properties of materials, which contact the memory element films. For example, the conductivity of a diffusion barrier layer may lead to the leakage or short circuit of current around the memory element films. This leakage or short circuit results in reduction in the performance of memory cells/devices.

Although not wishing to be bound by any theory, it is believed that the diffusion barrier layer containing a metal is sufficiently conductive to cause leakage or short circuit of the current around the memory element films. It also believed that, the present invention, by providing methods and structures to convert some portion of the conductive diffusion barrier layer into a non-conductive insulating material, can prevent the leakage and/or short circuit of current around the memory element films of memory cells, and thereby enhances the memory cell/device performance.

In the context of the present invention, the terms "memory element films" and "controllably conductive media" are used interchangeably. The memory element films comprise a passive layer and an active layer. The terms "passive layer" and "superionic layer" are used interchangeably and refer to the same layer. The term "polymer layer" is also referred to as "organic layer," "organic polymer layer," "semiconducting polymer layer," and "polymer film." The term "conformal diffusion barrier layer" and "diffusion barrier layer" are used interchangeably, and refer to a diffusion barrier layer that retains the same angles between all intersecting curves of the surface on which it is formed. The terms "top electrode" and "bottom electrode" in the present application are only for illustrative purposes and should not be considered as limiting. It should be appreciated that a person skilled in the art would be able to form electrodes of the present invention in different configurations/positions and still be within the scope of the present invention. Similarly, it is to be noted that a person skilled in the art would be able to refer to electrodes with different terms such as first and second, lower and higher, and the like, and still be within the scope of the present invention.

The present invention may be understood and its advantages appreciated in conjunction with the figures and drawings, wherein like numerals represent like features throughout.

Figure 1:
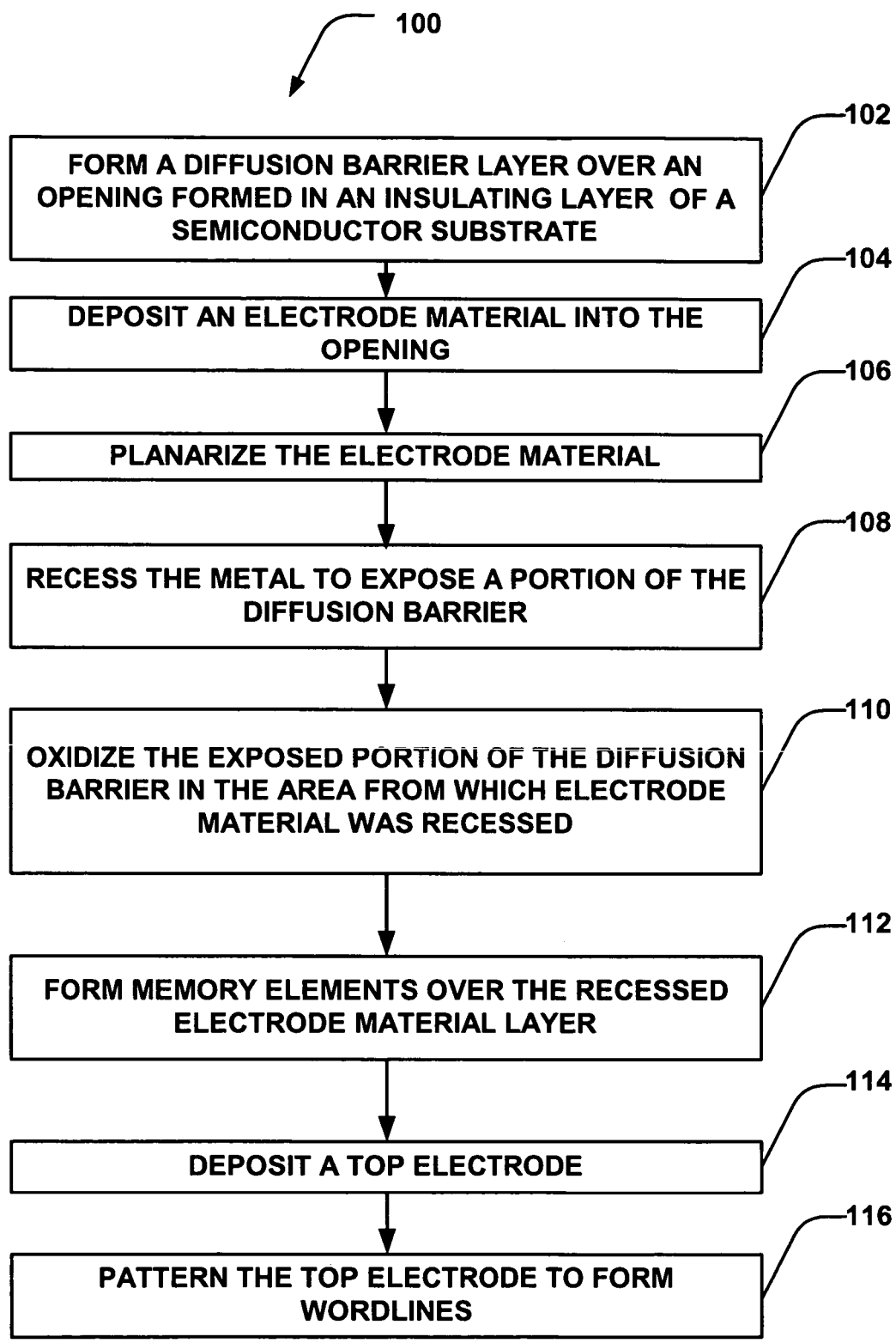
FIG. 1 is a flow chart showing an exemplary methodology for carrying out one aspect of the present invention.

Referring to FIG. 1, a flow chart of an exemplary methodology 100, for carrying out an aspect of the present invention, to improve conduction of memory element films of a memory cell is shown. The method 100 involves forming a conformal diffusion barrier layer over an opening formed in a dielectric layer of a substrate (act 102), deposition of an electrode material into the opening (act 104), planarizing the electrode material layer (act 106), recessing of part of the electrode material from the opening (act 108), oxidizing the diffusion barrier layer in the area from which the electrode material was recessed (act 110), forming memory element films (act 112), forming a top electrode (act 114), and patterning the memory cell (act 116). Optionally, the method 100 may also include forming a thin conductive metal barrier layer over the memory element films.

For simplicity of explanation, the methods are depicted and described as a series of acts. Also, the drawings and figures are only for illustrative purposes only and as such do not represent drawings and figures drawn to a scale. It is to be understood and appreciated that the present invention is not limited by the acts illustrated and/or by the order of acts, for example acts can occur in various orders and/or concurrently, and with other acts not presented and described herein. Furthermore, not all illustrated acts may be required to implement the methodologies in accordance with the present invention. In addition, those skilled in the art will understand and appreciate that the methodologies could alternatively be represented as a series of interrelated states via a state diagram or events.

Figure 2:
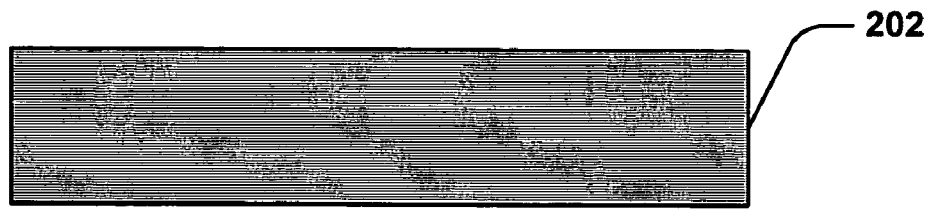
FIGS. 2–11 are cross sectional illustrations of a semiconductor substrate of a memory cell undergoing fabrication according to one aspect of the present invention.

Act 102 of method 100 is forming of a conformal diffusion barrier liner over an opening formed in a dielectric layer of a substrate. The substrate for act 102 can be any substrate used in the course of semiconductor processing or any semiconductor surface. FIG. 2 shows a cross sectional view of an exemplary substrate 202 prepared for carrying out act 102. The substrate 202 is formed using methods known to one skilled in the art. Examples of substrate 202 for the present invention include semiconductor materials such as gallium arsenide (GaAs), germanium, silicon, silicon germanium, lithium niobate, and compositions containing silicon such as crystalline silicon, polysilicon, amorphous silicon, epitaxial silicon, silicon dioxide ($SiO_2$), and mixtures thereof. Typically, the substrate 202 is a silicon substrate, optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc.

Figure 3:
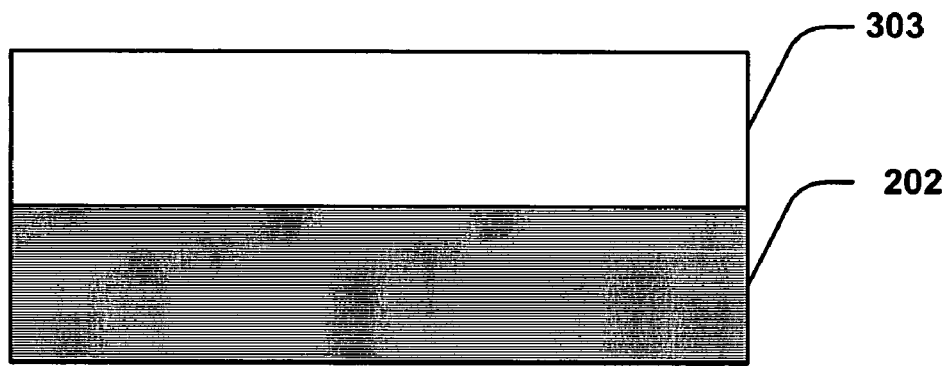

FIG. 3 shows a cross sectional view of a dielectric layer 303 on the substrate 202. Any dielectric material can be used. Both organic and inorganic dielectric materials may be used. Similarly, both low and high k dielectrics may be used. Also polymeric, amorphous, crystalline and monomeric materials can be used as dielectric materials for this invention. Examples of dielectric materials include silicon containing spin-on glasses such as alkoxysilane polymer, a siloxane polymer, a silsesquioxane polymer, a poly(arylene ether), a fluorinated poly(arylene ether), other polymer dielectrics, nanoporous silica or mixtures thereof. Optionally, prior to formation of dielectric layer 303 one or more layers of insulators, barriers, metal interconnects, and/or passivization layers can be formed on the substrate 202.

The dielectric layer 303 can be formed by any suitable technique. For example, chemical vapor deposition (CVD), plasma enhanced chemical vapor deposition (PECVD), low pressure chemical vapor deposition (LPCVD), or high pressure chemical vapor deposition (HPCVD) methods can be used. Polymeric dielectrics can also be formed by using spin-coating, dip-coating, spraying, or roller coating.

The dielectrics are deposited to a thickness appropriate to facilitate via formation and subsequent fabrication procedures. Typically, dielectrics are deposited to a thickness from about 1000 Å to about 50,000 Å. In one embodiment of the present invention, the dielectric layer 303 is deposited over substantially the entire surface of the substrate 202. In another embodiment of the present invention, the dielectric layer 303 is deposited on part of the surface of the substrate 202.

Optionally, the dielectric layer 303 may be heated. Heating of the dielectric layer 303 may be conducted at a temperature from about 80° C. to about 500° C. The duration of heating of the dielectric layer 303 may range from about 1 minute to about 10 hrs. The dielectric layer 303 of the present invention also acts as an insulating layer. Optionally, additional layers such as a cap layer, etch stop layer, metal layers may also be formed over the dielectric layer 303, before forming openings for vias.

Figure 4:
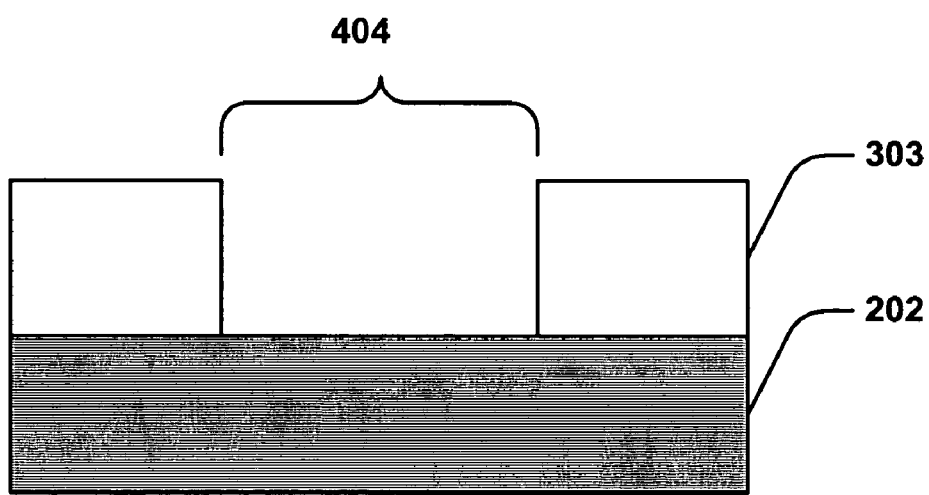

FIG. 4 shows forming of an opening 404 in the dielectric layer 303. In one embodiment of the present invention, the opening 404 is a via. Other examples of openings include trenches and lines. Vias are generally formed through an insulating material disposed on a substrate or between conductive layers. The via 404 can be formed by employing any standard technique. For example, the via 404 can be formed by a lithography process followed by etching. Lithography can use both positive and negative resists, which are available commercially. Lithographic techniques for forming vias in a dielectric are well known in the art. Any etching process can be used for forming the via 404. For example, a plasma etch can be used to form the via 404. Plasma etch can take place in a parallel plate reactor using an ion-assisted reactant. The resist is completely removed from the dielectric surface and the inside walls of the via 404 by plasma etching. The via 404 can have relatively vertical sidewalls which extend perpendicular to the topological surface of the dielectric layer 303.

Figure 5:
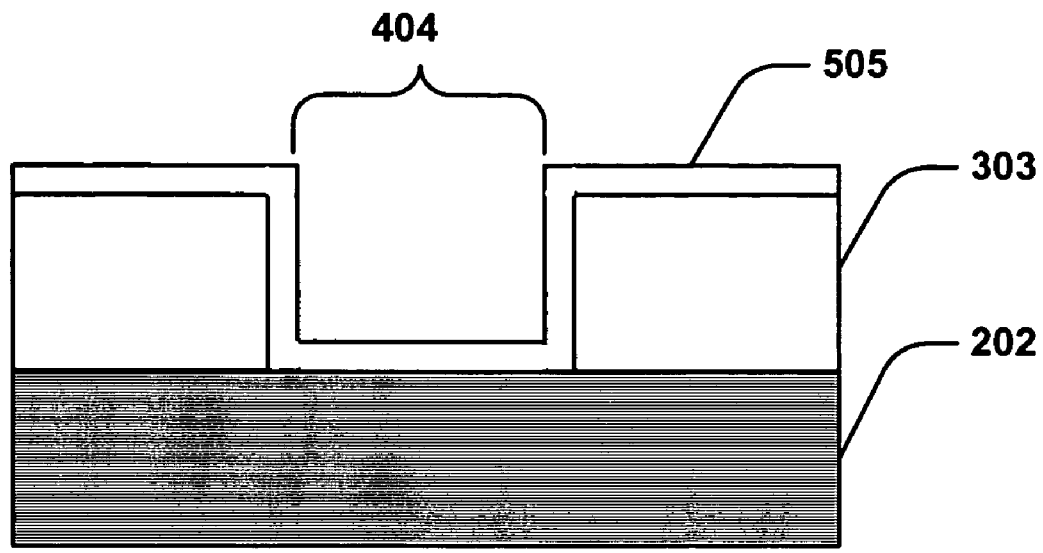

FIG. 5 shows forming of a conformal diffusion barrier layer 505 over the via 404. The diffusion barrier layer may be formed upon the surface of the dielectric layer 303 such that the substrate 202 at the base of the via 404 is covered with the diffusion barrier layer 505. The diffusion barrier layer 505 is formed before deposition of a metal. The criterion for selecting a barrier metal is that the barrier metal and the electrode material have significantly different removal selectivity characteristics. Any suitable metal that meets the above criteria can be used as the diffusion barrier. Examples of barrier metals include titanium, titanium nitride, tantalum, tantalum nitride, or any combination thereof. In one embodiment of the present invention, tantalum (Ta) is used as the diffusion barrier. In another embodiment of the present invention, compounds or alloys containing Ta are used as the diffusion barrier. Examples include tantalum oxide, tantalum chloride, tantalum bromides, tantalum sulfide, tantalum nitride and the like.

The diffusion barrier layer 505 can be formed by any suitable method. For example, the diffusion barrier layer 505 can be formed by deposition techniques such as CVD, PVD, PECVD, LPCVD, sputtering, evaporation, or electroplating.

The thickness of the diffusion barrier layer 505 is controlled. For example, in one embodiment of the present invention, the diffusion barrier layer 505 can have a thickness from about 1 Å to about 200 Å. In another embodiment, the thickness of the diffusion barrier layer 505 is from about 5 Å to about 50 Å. In yet another embodiment of the present invention, the diffusion barrier layer 505 has a thickness of about 20 Å.

Figure 6:
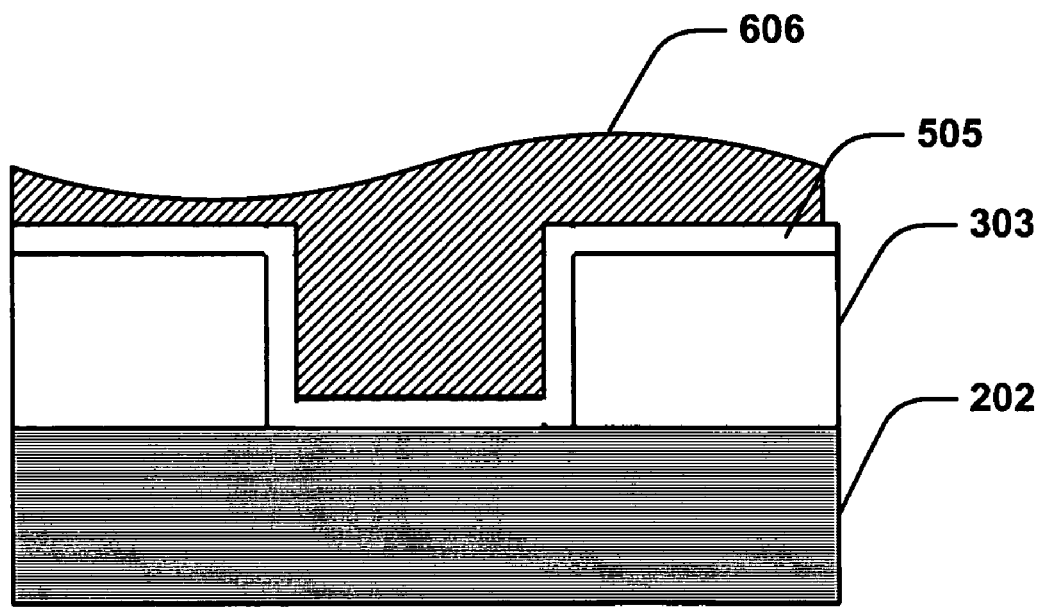

Act 104 of method 100 is deposition of an electrode material into the opening 404. FIG. 6 shows a cross sectional illustration of an electrode material layer 606 in a via undergoing fabrication in accordance with one aspect of the present invention. Any suitable electrode material can be used to fill the vias. For example, metals and conducting polymers can be used as electrode material. Example of metals which can be used as electrode material 606 include copper, tungsten, silver, gold, bismuth and the like. In one embodiment of the present invention, copper is used as the electrode material 606. In another embodiment of the present invention, compounds of copper, alloys of copper, and/or mixtures thereof are used as the electrode material 606.

In one embodiment of the present invention, the electrode material layer 606 forms a bottom electrode. In another embodiment of the present invention, the electrode material layer 606 acts as a memory plug.

The electrode material layer 606 is deposited using standard depositing techniques. For example, CVD, PVD, PECVD, evaporation, sputtering, atomic layer deposition and the like can be used. In one embodiment of the present invention, a seed layer of metal is formed over the diffusion barrier layer 505. This seed layer is typically on the order of about 1000–3000 Å in thickness and is either pure metal or a metal alloy. The seed layer is formed using a technique such as CVD. In one embodiment, the seed layer may also interact with the previously deposited barrier layer 404. After formation of the seed layer, the metal layer is completed by depositing additional metal using electroplating and/or blanket deposition. The additional metal may be either pure metal or an alloy.

The electrode material layer 606 is deposited such that it covers the opening 404. The deposited metal accumulates within the via 404 to an elevational level above the adjacent surface of the dielectric layer 303. In one embodiment of the present invention, the metal is filled to cover the dielectric layer 303. Typically, the electrode material layer 606 has a thickness from about 1000 to 20,000 Å. Optionally the electrode material layer 606 is doped using techniques such as ion implantation and diffusion. Any suitable dopant may be used.

Act 106 of method 100 is planarization of the electrode material layer 606. The planarization can be performed by any suitable technique. For example, chemical mechanical polishing, reactive ion etching, or plasma etching can be used. The electrode material is planarized to the top of the dielectric layer 303 by removing the electrode material from the top of the dielectric layer 303. The electrode material which remains exclusively within the via forms a bottom electrode or a metal plug. The electrode material layer 606 is removed such that the upper face of the electrode material layer is at approximately the same planar level as the dielectric surface. Once the electrode material is removed from the dielectric surface, a portion of the diffusion barrier layer 404 adjacent to the via is exposed. In one embodiment of the present invention, the planarization includes removal of the diffusion barrier layer from the surface of the dielectric layer except in the opening 404.

Figure 7:
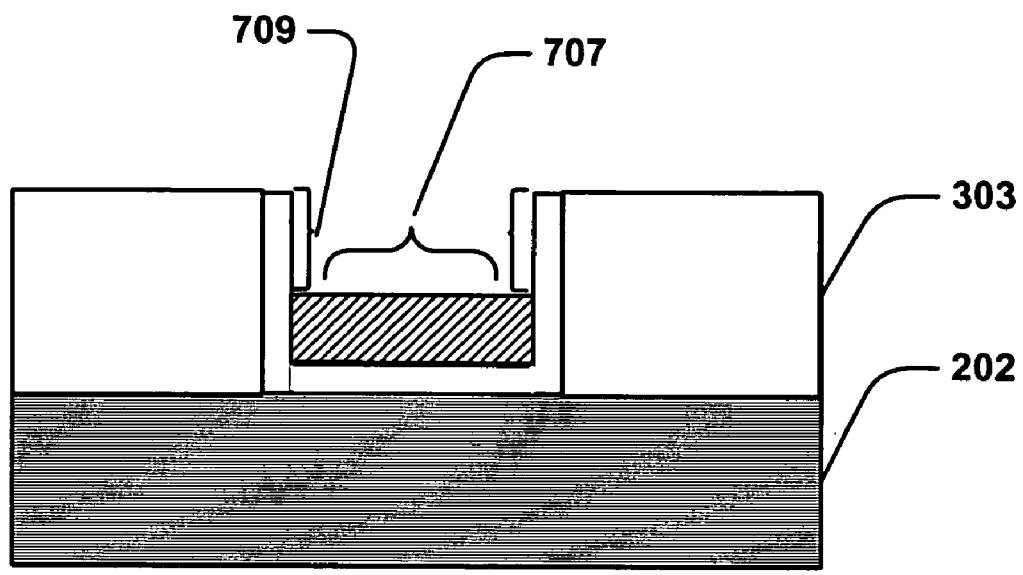

Act 108 of the method 100 is recessing of surface of a certain part of the electrode material layer 606 thereby exposing a portion of the diffusion barrier layer 505. The recess extends below the upper most parts portions of the via 404. In one embodiment of the present invention, the metal layer is recessed to a level sufficient to form memory elements. FIG. 7 is a cross sectional illustration of a memory cell undergoing fabrication, showing removal of the recessed electrode material layer 707 and the exposed portion of the diffusion barrier.

Any suitable method can be used to recess the electrode material layer 606. For example, an etching can be used. Etching can be through either a wet etch or a dry etch. In one embodiment of the present invention, the metal recess is achieved by performing a plasma etch, wet etch, or electro polishing, following a conventional chemical mechanical polishing step. In another embodiment of the present invention, the metal recess is formed using a reactive ion etching process. The critical factor for recessing is that the removal of fill metal is accomplished without significant removal of barrier metal. In yet another embodiment, the recess is formed by using a wet etchant in a spin-etch process. In such a spin-etch process, the substrate is placed on a chuck, rotated at a suitable speed such as 100 rpm, and the etchant dispersed onto the substrate. The etch process is typically carried out for a time of 1–60 seconds in duration. The etch is followed by a cleaning step.

The etchant chemistry employed to recess the electrode material layer 606 depends on the etch requirements. In one embodiment, a peroxide based etchant is used. In another embodiment, an acid based etchant is used. In yet another embodiment, an etchant containing both an acid and a peroxide is used. For example, a mixture of sulfuric acid and hydrogen peroxide can be used as a wet etchant.

The etch rate can be adjusted to obtain proper etching. In one example, an etch rate from about 0.5 to about 10 μm/min is employed. The etching can be either isotropic or anisotropic. The temperature at which the etch is carried out ranges from about 10° C. to 100° C.

The amount of electrode material to be recessed is determined by the thickness requirements of subsequently formed memory element films and top electrode. Typically, the recess is from about 100–10,000 Å in depth and is approximately ¼ to ⅓ the depth of the via opening.

Figure 8:
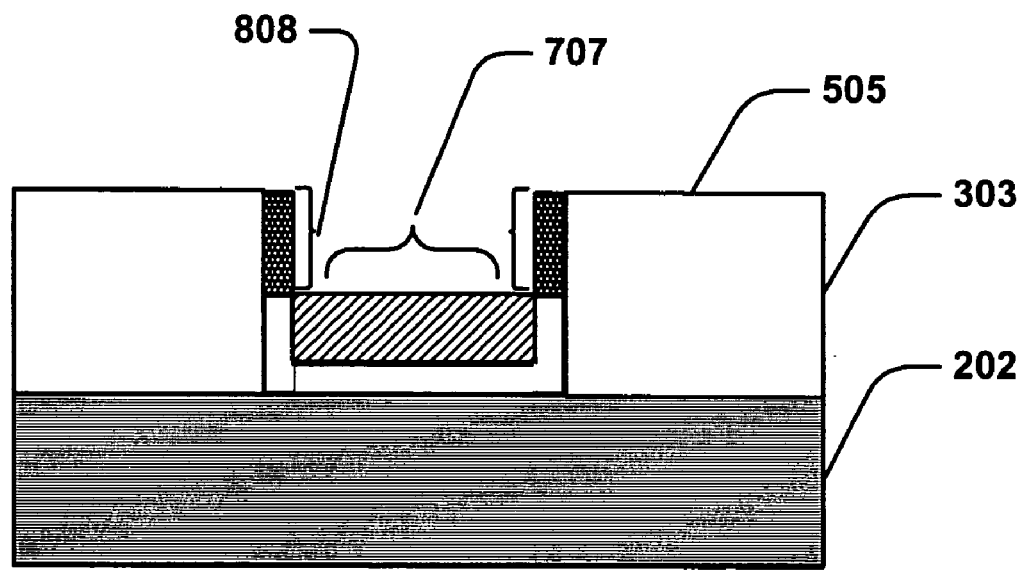

Act 110 of method 100 is oxidizing the exposed part of the metal in the diffusion barrier layer 707 to a metal oxide. For example, where the exposed diffusion barrier metal 707 comprises Ta, the Ta is oxidized to form a Ta oxide. Tantalum has different oxidation states, and therefore, different Ta oxides can result from the oxidation of Ta. For the present invention, the nature of the Ta oxide is not critical. FIG. 8 illustrates a cross sectional view of a memory cell undergoing fabrication with the barrier diffusion layer 505 containing an oxidized diffusion barrier metal 808.

The metal in the exposed diffusion barrier layer 709 can be oxidized using any suitable method. For example, chemical oxidation, CVD, chemical etching, anodic oxidation, thermal oxidation, and ion implantation can be used to oxidize tantalum. In one example, Ta is oxidized simultaneously along with recessing of the electrode material layer 606, in the same etching step by adjusting etch parameters. In another embodiment of the present invention, the diffusion barrier metal is oxidized subsequent to the recessing of the electrode material layer 606. Oxidation of the diffusion barrier metal causes the conductive diffusion barrier metal to change into an insulating metal oxide.

Figure 9:
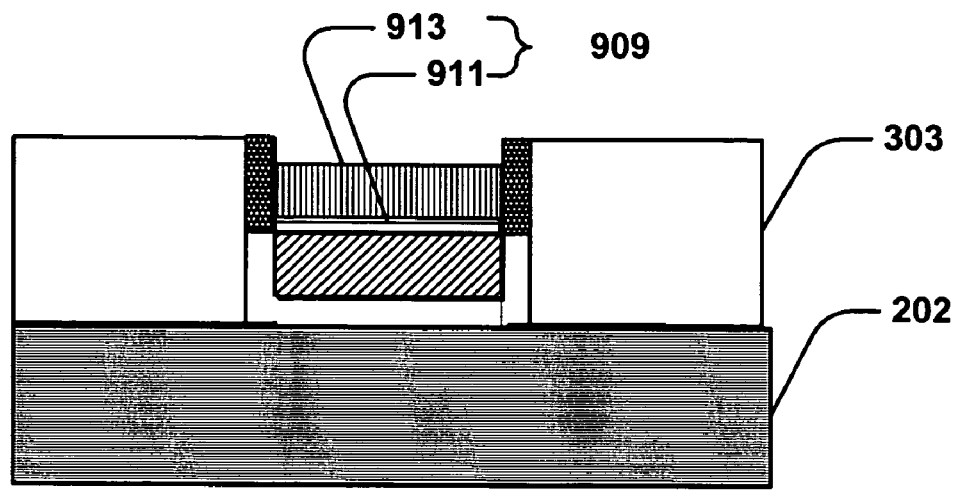

Act 112 of method 100 is forming memory element films adjacent to the oxidized diffusion barrier layer 808. The memory element films include one or more of passive layers and one or more of active layers. FIG. 9 is a cross sectional illustration of a memory cell undergoing fabrication according to one aspect of the present invention, and showing formation of memory element film 909. The memory element 909 contains a passive layer 911 and an active layer 913. Optionally, additional layers such as adhesion enhancing layer, charge retention enhancing layer, and the like may be formed over the metal layer 606 before formation of memory element film 909.

The passive layer 911 is formed adjacent to the electrode material layer 606. The passive layer 911 can be made of at least one conductivity facilitating compound. Examples of conductivity facilitating compounds that may constitute the passive layer 911 include one or more of copper sulfide ($CU_2S$, CuS), copper rich copper sulfide ($Cu_3S$, CuS; $Cu_3S$, $Cu_2S$), copper oxide (CuO, $Cu_2O$), copper selenide ($Cu_2Se$, CuSe), copper telluride ($Cu_2Te$, CuTe), silver sulfide ($Ag_2S$, AgS), gold sulfide ($Au_2S$, AuS), and the like. The conductivity facilitating compounds do not necessarily dissociate into ions under the strength of the electric field, although ions may move through them. The passive layer 911 may contain two or more subpassive layers, each sublayer containing the same, different, or multiple conductivity facilitating compounds.

The passive layer 911 is formed using oxidation techniques, formed via gas phase reactions, implantation techniques, or deposited. In some instances, the passive layer 911 may be treated with a plasma after it is formed. The plasma treatment modifies the energy barrier of the passive layer 911.

In one embodiment, the passive layer 911 containing the conductivity facilitating compound has a thickness of about 2 Å or more. In another embodiment, the passive layer 911 has a thickness of about 10 Å or more. In yet another embodiment, the passive layer 911 has a thickness of about 50 Å or more.

The active layer 913 of the present invention can be formed using any suitable low conducting material. Examples of materials that can be used in the formation of the active layer 913 include organic semiconducting materials, inorganic semiconducting materials, and mixtures of organic and inorganic semiconducting materials. The active layer can be formed using techniques well known to a person in the art.

General examples of the organic semiconducting materials include at least one of an organic polymer (such as a conjugated organic polymer), an organometallic compound (such as a conjugated organometallic compound), an organometallic polymer (such as a conjugated organometallic polymer), a buckyball, a carbon nanotube (such as a C6–C60 carbon nanotubes), and the like.

General examples of the low conducting inorganic materials include transition metal sulfides, chalcogenides, and transition metal oxides. Examples of inorganic materials include cupper oxide (CuO, $Cu_2O$), iron oxide (FeO, $Fe_3O_4$), manganese oxide ($MnO_2$, $Mn_2O_3$, etc), titanium oxide ($TiO_2$).

The active layer can also contain a mixture of organic and inorganic materials. The inorganic material (transition metal oxide/sulfide) is usually embedded in an organic semiconductor material. Examples include polyphenylacetylene mixed with $Cu_2S$, polyphenylacetylene mixed with $Cu_2O$, and the like. Hereinafter, the present invention is described using a semiconducting polymer layer as an exemplary active layer 913.

The semiconducting polymer layer 913 of the present invention can contain at least one semiconducting polymer. The semiconducting polymer layer 913 can be formed by spin-on techniques (depositing a mixture of the polymer/polymer precursor and a solvent, then removing the solvent from the substrate/electrode), by CVD, optionally including a gas reaction, gas phase deposition, and the like. CVD includes LPCVD, PECVD, and HDCVD. During formation or deposition, the polymer material may self assemble between the electrodes. It is not typically necessary to functionalize one or more ends of the organic polymer in order to attach it to an electrode/passive layer.

The semiconducting polymer layer 913 can contain one or more semiconducting polymers. Examples of semiconducting polymers include conjugated organic polymers, organometallic polymers, carbon structures such as carbon nanotubes and buckyballs, and the like.

A carbon nanotube is typically a hexagonal network of carbon atoms that is rolled up into a seamless cylinder. Each end may be capped with half of a fullerene molecule. Carbon nanotubes may be prepared by the laser vaporization of a carbon target (a cobalt-nickel catalyst may facilitate growth) or a carbon-arc method to grow similar arrays of single-wall nanotubes. A buckyball is more specifically a buckminsterfullerene, a soccer-ball-shaped 60-atom or 70-atom cluster of pure carbon.

The organic polymer typically contains a conjugated organic polymer. The polymer backbone of the conjugated organic polymer extends lengthwise between the electrodes. The conjugated organic polymer may be linear or branched, so long as the polymer retains its conjugated nature. Conjugated polymers are characterized in that they have overlapping π orbitals. Conjugated polymers are also characterized in that they may assume two or more resonant structures. The conjugated nature of the conjugated organic polymer contributes to the controllably conductive properties of the controllably conductive media.

In this connection, the semiconducting polymer, such as a conjugated organic polymer, has the ability to donate and accept charges (holes and/or electrons). Generally, the semiconducting polymer or an atom/moiety in the polymer has at least two relatively stable states. The two relatively stable oxidation states permit the semiconducting polymer to donate and accept charges and electrically interact with the conductivity facilitating compound. The ability of the semiconducting polymer layer 913 to donate and accept charges and electrically interact with the passive layer 911 also depends on the identity of the conductivity facilitating compound.

The organic polymers (or the organic monomers constituting the organic polymers) may be cyclic or acyclic. During formation or deposition, the organic polymer self assembles between the electrodes. Examples of conjugated organic polymers include one or more of poly(p-phenylene vinylene); polyporphyrins; porphyrinic macrocycles, thiol-derivatized polyporphyrins; polymetallocenes such as polyferrocenes, polyphthalocyanines; polyvinylenes; polystiroles; polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl)diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl)phenylacetylene; poly(trimethylsilyl) pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes (Fe, V, Cr, Co, Ni and the like); polypyridine metal complexes (Ru, Os and the like); and the like.

Figure 10:
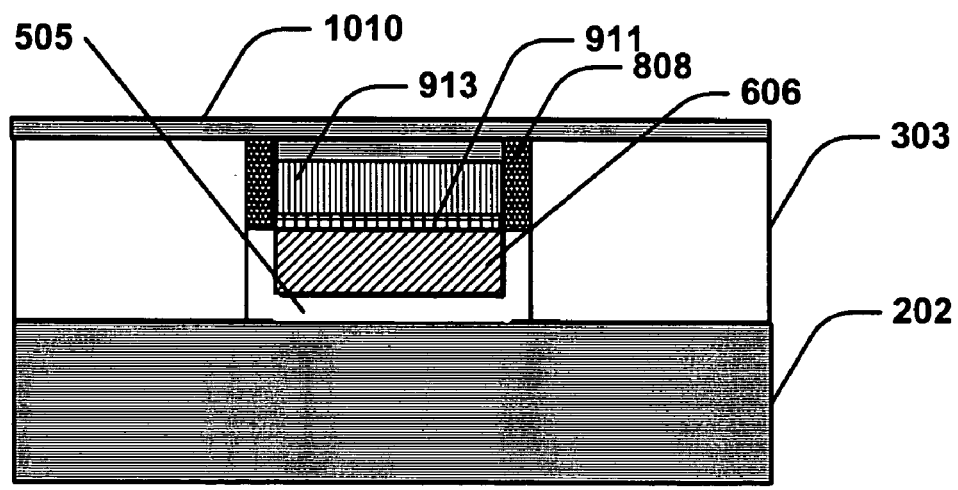

Optionally, a thin conductive metal barrier layer may be formed over the memory element films 909. The thin conductive barrier metal layer may cover the surface of the dielectric layer 303. FIG. 10 is a cross sectional illustration of a memory cell undergoing fabrication according to one aspect of the present invention and shows the formation of the thin conductive metal barrier layer 1010 over the memory element films 909. The thin conductive metal barrier 1010 can be of any suitable material. In one embodiment of the present invention, the thin conductive metal barrier layer 1010 contained titanium or titanium nitride. The thin conductive metal barrier layer 1010 can have a thickness from about 10 to about 200 Å. The thin conductive metal layer 1010 is formed using any suitable technique. For example, CVD, PVD, evaporation, sputtering, and electro plating can be used.

Figure 11:
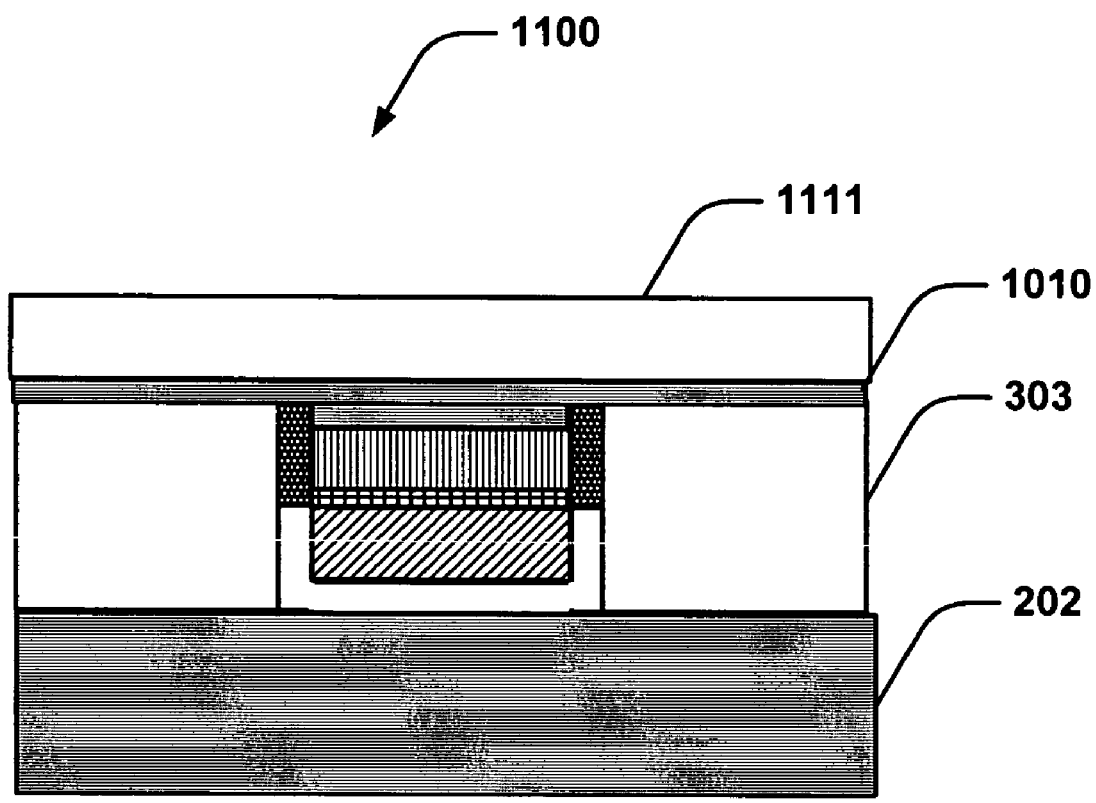

Act 114 of method 100 is forming a top electrode on the substrate over the memory filament film 909. The top electrode 1111 is formed using methods known to one skilled in the art. For example, the top electrode 1111 is formed by depositing metals using techniques such as etching, evaporation, PVD, CVD, and PECVD. In one embodiment of the present invention, the top electrode 1111 can be formed over the thin conductive metal barrier layer 1010. FIG. 11 is a cross sectional illustration of a polymer memory cell 1100 showing the top electrode 1111 formed over the thin conductive metal barrier layer 1010 according to one aspect of the present invention. Optionally, additional layers such as etch stop layers, cap layers, insulating layers, dielectric layers, and the like may be formed before the depositing the top electrode 1111.

The top electrode 1111 may or may not cover the entire surface of the substrate 202. The top electrode 1111 is made of conductive material, such as a conductive metal, conductive metal alloys, conductive metal oxides, conductive polymer films, semiconductor materials, and the like. Specific examples of materials for the top electrode 1111 include one or more of aluminum, chromium, copper, germanium, gold, magnesium, manganese, indium, iron, nickel, palladium, platinum, silver, titanium, zinc, and alloys thereof; indium-tin oxide (ITO); polysilicon; doped amorphous silicon; metal silicides; and the like. Alloy electrodes specifically include Hastelloy®, Kovar®, Invar, Monel®, Inconel®, brass, stainless steel, magnesium-silver alloy, and various other alloys.

The thickness and width of the top electrode 1111 may depend upon the specific lithography and design rules. In one embodiment, the thickness of the top electrode 1111 is about 0.01 μm or more and about 10 μm or less. In another embodiment, the thickness of the top electrode 1111 is about 0.05 μm or more and about 5 μm or less. In yet another embodiment, the thickness of the top electrode 1111 is about 0.1 μm or more and about 1 μm or less.

The position of the top electrode 1111 is not critical for the present invention and one skilled in the art would recognize that the first electrode could be placed in a variety of positions without losing the advantages of the present invention.

The top electrode 1111 is patterned to form wordlines using standard techniques. It is to be understood that these acts may be repeated to provide a series of suitable layers and conductive paths over one another on the substrate.

Figure 12:
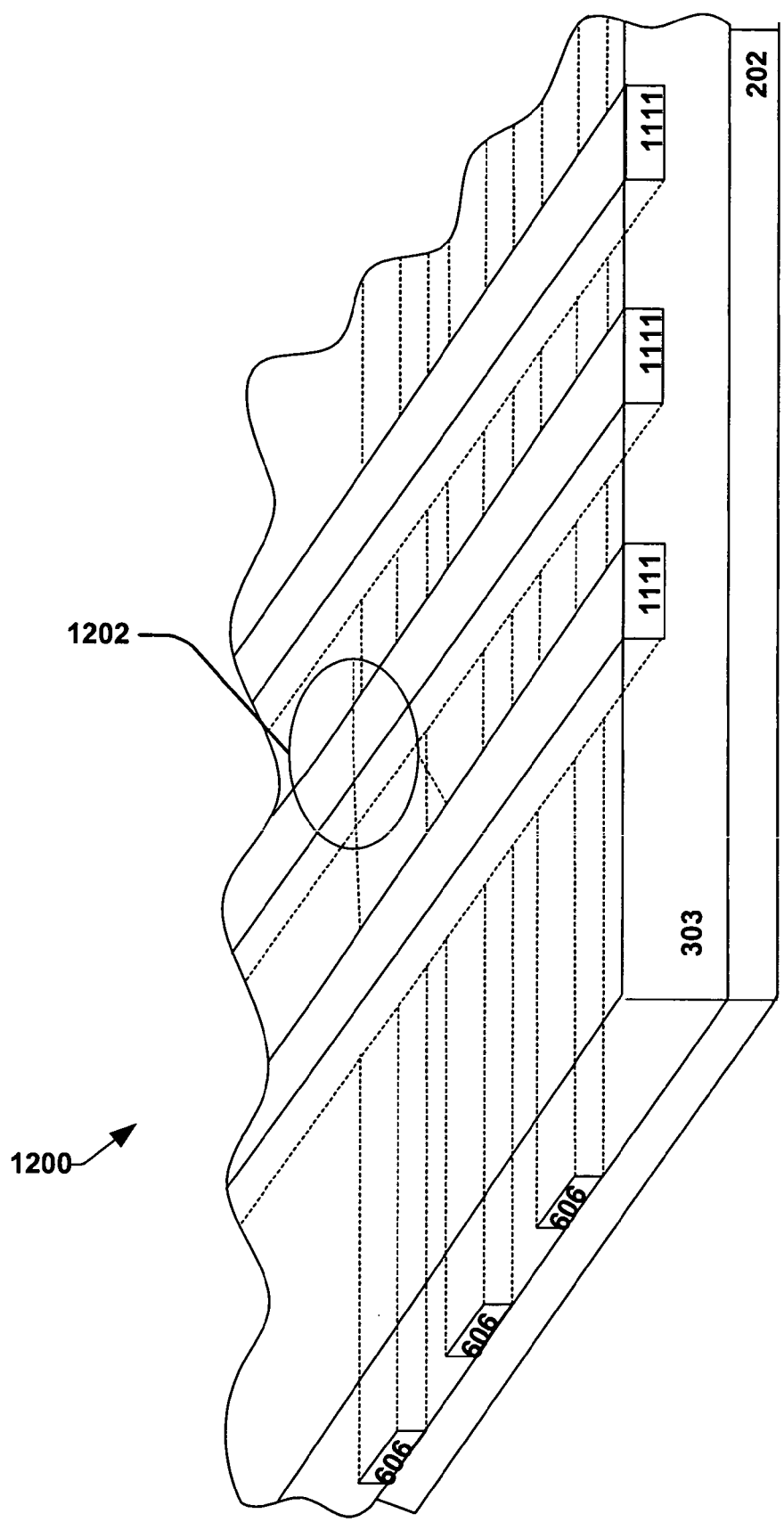
FIG. 12 is a memory device containing multiple memory cells fabricated according to one aspect of the present invention.

According to another aspect of the present invention, a memory device is provided, which exhibits improved conduction properties. Referring to FIG. 12, a brief description of the microelectronic memory device 1200 containing a plurality of memory cells positioned on or over a substrate 202 in accordance with one aspect of the invention is shown. The memory device 1200 contains a desired number of memory cells, as determined by the number of rows, columns, and layers (three dimensional orientation described later) positioned on a substrate 202.

Figure 13:
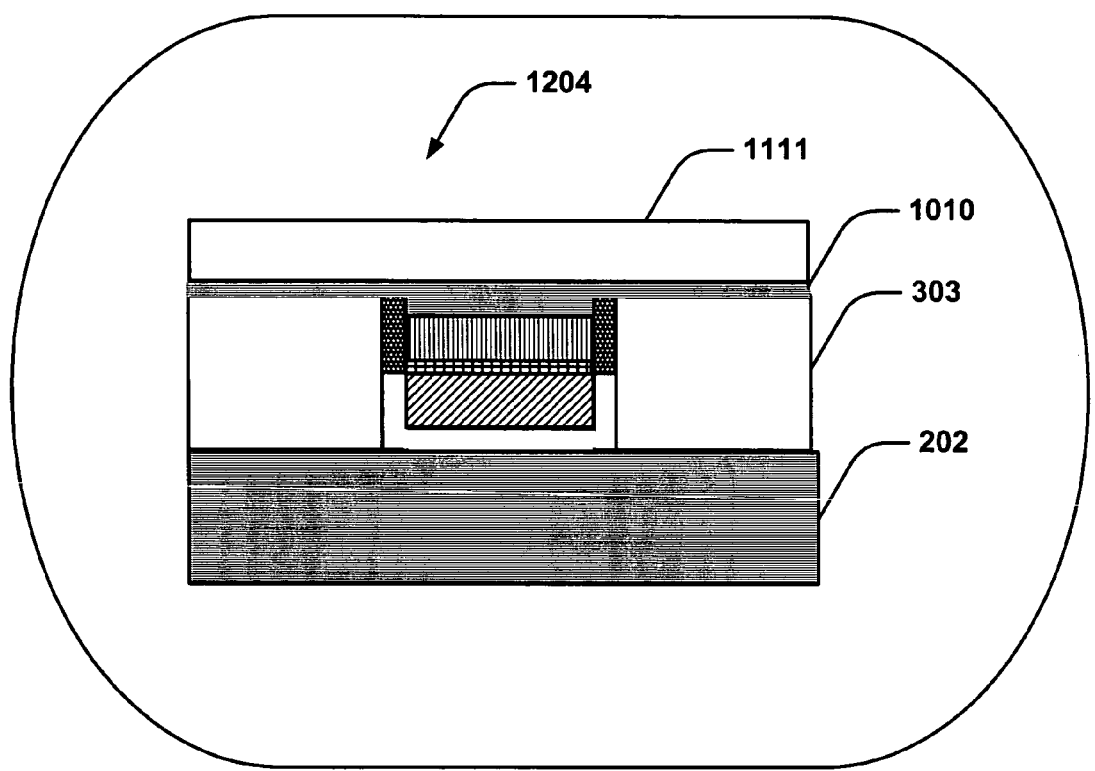
FIG. 13 is an exploded view of a memory cell of the memory device described in FIG. 12.

The memory cells for memory device 1200 are formed in a dielectric 303 over a substrate 202, as described earlier. The top electrodes 1111 and the bottom electrodes 606 are shown in substantially perpendicular orientation, although other orientations are possible to achieve the structure of the exploded view 1202. An exploded view 1202 of a memory cell 1204 shown in FIG. 13 and contains a substrate 202, a dielectric layer 303 with a via 404, a diffusion barrier layer 505, a bottom electrode 606, a passive layer 911, an active layer 913, and a top electrode 1111, wherein the diffusion barrier layer 808 adjacent to the memory films 909 is oxidized. Peripheral circuitry and devices are not shown for brevity. The fabrication of these components of a memory cell have been described earlier during the discussion of the method 100, and all techniques and materials described in relation to method 100 can also be used to manufacture device 1200.

Operation of memory devices/cells is facilitated using an external stimulus to achieve a switching effect. The external stimuli include an external electric field and/or light radiation. Under various conditions, the memory cell is either conductive (low impedance or "on" state) or non-conductive (high impedance or "off" state).

The active layer 913 along with the passive layer 911 comprises controllably conductive media. The controllably conductive media can be rendered conductive or non-conductive in a controllable manner using an external stimulus. Generally, in the absence of an external stimulus, the controllably conductive media is non-conductive or has high impedance. Further, in some embodiments, multiple degrees of conductivity/resistivity may be established for the controllably conductive media in a controllable manner. For example, the multiple degrees of conductivity/resistivity for the controllably conductive media may include a non-conductive state, a highly conductive state, a semiconductive state, and resistive state(s) with various levels of resistance (in other words, the controllably conductive media may have a plurality of conductive states).

The conductivity facilitating compound of the passive layer 911 contributes to the controllably conductive properties of the controllably conductive media. The conductivity facilitating compound has the ability to donate and accept charges (holes and/or electrons) and/or act as a source of ions. Thus, the passive layer 911 may transport holes, electrons, and/or ions between an electrode and the semiconducting polymer layer 913/passive layer 911 interface, facilitate charge/carrier injection into the organic semiconducting polymer layer 913, and/or increase the concentration of a charge carrier (ions, holes and/or electrons) in the semiconducting polymer layer 913. In some instances, the passive layer 911 may store opposite charges thereby providing a balance of charges in the organic memory device as a whole. Storing charges/charge carriers is facilitated by the existence of two relatively stable oxidation states for the conductivity facilitating compound. The present invention advantageously prevents and/or eliminates the leakage and short circuit of current (charge) from the controllably conducive media.

The methods and systems of improving conduction characteristics of a memory cell/device described in the present invention are useful for any device requiring memory. For example, the semiconducting devices with improved memory performance are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the organic memory devices. Examples of hand-held devices include cell phones and other two way communication devices, personal data assistants, pagers, notebook computers, remote controls, recorders (video and audio), radios, small televisions and web viewers, cameras, and the like.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for fabricating a memory element comprising:
   forming a diffusion barrier layer over an opening formed in a dielectric layer of a semiconductor substrate;
   depositing an electrode material into the opening;
   recessing a portion of the electrode material from the opening to expose a portion of the diffusion barrier layer using a wet etch;
   oxidizing the exposed portion of the diffusion barrier layer;
   forming memory element films over the electrode material, the memory element films comprising a passive layer and an active layer; and
   forming a top electrode over the memory element films.

2. The method claim 1, wherein the electrode material deposited into the opening comprises a metal.

3. The method of claim 1, wherein the electrode material deposited into the opening comprises copper.

4. The method of claim 1, wherein the diffusion barrier layer comprises at least one of tantalum, compounds of tantalum, and alloys of tantalum.

5. The method of claim 1, wherein the diffusion barrier layer has a thickness from about 5 Å to about 50 Å.

6. The method of claim 1, wherein the oxidation of the diffusion barrier layer is carried out using a technique selected from the group consisting of thermal oxidation, anodic oxidation, chemical oxidation, reactive ion etch, implantation, and wet etch.

7. The method claim 1, wherein recessing the electrode material in the opening and oxidizing the exposed portion of the diffusion barrier layer occur simultaneously.

8. The method of claim 1, wherein oxidizing the exposed portion of the diffusion barrier layer occurs subsequent to recessing of the electrode material from the opening.

9. The method of claim 1, further comprising forming a thin conductive metal barrier layer over the memory element films.

10. The method of claim 1, wherein the wet etch is performed by using an acid based etchant.

11. The method of claim 1, wherein the wet etch is performed by using a peroxide based etchant.

12. The method of claim 1, wherein oxidizing the exposed portion of the diffusion barrier layer comprises oxidizing tantalum to a tantalum oxide.

13. The method of claim 1, wherein the passive layer comprises copper sulfide.

14. The method of claim 1, wherein the active layer comprises a semiconducting polymer.

15. A memory cell comprising:
    a bottom electrode;
    a memory element film over the bottom electrode;
    a top electrode over the memory element film;
    a thin conductive metal barrier layer between the memory element film and the top electrode, the thin conductive barrier layer having a thickness from about 10 Å to about 200 Å, and
    a diffusion barrier layer at least partially surrounding the bottom electrode, the memory element film, the thin conductive metal barrier layer, and the top electrode,
    wherein the diffusion barrier layer adjacent the memory element film and the top electrode comprises an oxidized diffusion barrier metal.

16. The memory cell of claim 15, wherein the diffusion barrier layer has a thickness from about 5 Å to about 50 Å.

17. The memory cell of claim 15, wherein the bottom electrode comprises copper.

18. The memory cell of claim 15, wherein the memory film comprises a passive layer and an active layer.

19. The memory cell of claim 18, wherein the passive layer comprises copper sulfide.

20. The memory cell of claim 18, wherein the active layer comprises a semiconducting polymer.

21. The memory cell of claim 15, wherein the diffusion barrier layer comprises tantalum oxide and at least one of tantalum, compounds of tantalum, and alloys of tantalum.

22. A memory cell comprising:
  a bottom electrode;
  a memory element film over the bottom electrode, wherein the memory element film comprises a passive layer and an active layer, the passive layer comprising copper sulfide;
  a top electrode over the memory element film, and
  a diffusion barrier layer at least partially surrounding the bottom electrode, the memory element film, and the top electrode,
  wherein the diffusion barrier layer adjacent the memory element film and the top electrode comprises an oxidized diffusion barrier metal.

* * * * *